(12) United States Patent
Seok

(10) Patent No.: US 9,793,034 B2
(45) Date of Patent: Oct. 17, 2017

(54) SEMICONDUCTOR MODULE HAVING A TAB PIN WITH NO TIE BAR

(71) Applicant: SAMSUNG ELECTRONICS CO., LTD., Suwon-si, Gyeonggi-do (KR)

(72) Inventor: Jong-hyun Seok, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 160 days.

(21) Appl. No.: 14/625,983

(22) Filed: Feb. 19, 2015

(65) Prior Publication Data

US 2015/0373848 A1 Dec. 24, 2015

(30) Foreign Application Priority Data

Jun. 24, 2014 (KR) ........................ 10-2014-0077492

(51) Int. Cl.
| | | |
|---|---|---|
| *H01C 13/02* | (2006.01) | |
| *G11C 5/04* | (2006.01) | |
| *H05K 1/11* | (2006.01) | |
| *G11C 11/401* | (2006.01) | |
| *G11C 7/10* | (2006.01) | |
| *H05K 3/34* | (2006.01) | |

(52) U.S. Cl.
CPC ............... *H01C 13/02* (2013.01); *G11C 5/04* (2013.01); *H05K 1/117* (2013.01); *G11C 7/10* (2013.01); *G11C 11/401* (2013.01); *H05K 3/3415* (2013.01); *H05K 2201/0385* (2013.01); *H05K 2201/09545* (2013.01); *H05K 2201/10159* (2013.01)

(58) Field of Classification Search
CPC . H01L 2924/01029; H01L 2924/01078; H01L 2924/01079; H01L 23/52; H01L 23/48; H01L 23/481; H01L 23/5226; H01C 13/02; H05K 1/117; G11C 5/04
USPC ......................................................... 257/774
See application file for complete search history.

(56) References Cited

U.S. PATENT DOCUMENTS

| | | | |
|---|---|---|---|
| 6,192,580 B1 | 2/2001 | Hayami | |
| 6,423,904 B1 | 7/2002 | Hayami | |
| 7,667,311 B2 * | 2/2010 | Furuyama | ............ G02B 6/4201 257/678 |
| 8,772,950 B2 * | 7/2014 | Chuang | ................. H01L 23/562 257/127 |
| 2007/0292993 A1 * | 12/2007 | Tanoue | ............... H01L 21/4846 438/123 |
| 2008/0284041 A1 * | 11/2008 | Jang | ................. H01L 21/76898 257/774 |

FOREIGN PATENT DOCUMENTS

| | | |
|---|---|---|
| JP | 09-162508 | 6/1997 |
| KR | 10-0060396 | 3/1993 |
| KR | 10-1996-0056146 | 11/1996 |
| KR | 10-1999-0030952 A | 5/1999 |

(Continued)

*Primary Examiner* — Monica D Harrison
(74) *Attorney, Agent, or Firm* — Lee & Morse, P.C.

(57) ABSTRACT

A semiconductor module includes a printed circuit board including an integrated circuit chip, connecting terminals at an edge of the printed circuit board, and signal lines respectively connecting electrical connection pads of the integrated circuit chip to the connecting terminals. The connecting terminals are plated using via-holes of the printed circuit board respectively connected to the signal lines.

21 Claims, 10 Drawing Sheets

(56) References Cited

FOREIGN PATENT DOCUMENTS

| | | |
|---|---|---|
| KR | 10-1999-0050156 A | 7/1999 |
| KR | 10-2002-0090047 A | 11/2002 |
| KR | 10-2006-0030548 A | 4/2006 |
| KR | 10-2006-0086296 A | 7/2006 |
| KR | 10-2007-0048950 A | 5/2007 |
| KR | 10-2007-0096303 A | 10/2007 |
| KR | 10-0780092 B1 | 11/2007 |
| KR | 10-2007-0118349 A | 12/2007 |

* cited by examiner

SEMICONDUCTOR MODULE HAVING A TAB PIN WITH NO TIE BAR

CROSS-REFERENCE TO RELATED APPLICATION

Korean Patent Application No. 10-2014-0077492, filed on Jun. 24, 2014, and entitled, "Semiconductor Module Having Tab Pin With No Tie Bar," is incorporated by reference herein in its entirety.

BACKGROUND

1. Field

One or more embodiments described herein relate to a semiconductor module having a tab pin with no tie bar.

2. Description of the Related Art

Electrical wires and devices are typically mounted on a printed circuit board. One type of printed circuit board has edge connector-type terminals (or tab pins). This type of board may be used, for example, in a memory module. The tab pins are electrically connected to an electronic device by inserting them into a socket. The tab pins may be plated to obtain secure electrical connections.

Plating lines (or tie bars) may be formed on the tab pins when plating is performed. Accordingly, when a tab pin is inserted in a socket, the tie bar may easily break or flake, and thus may separate from the tab pin. A broken or flaked tie bar may cause an electrical short.

SUMMARY

In accordance with one embodiment, a semiconductor module includes a printed circuit board including an integrated circuit chip; connecting terminals at an edge of the printed circuit board; and signal lines respectively connecting electrical connection pads of the integrated circuit chip to the connecting terminals, wherein the connecting terminals are plated by via-holes of the printed circuit board are respectively connected to the signal lines.

The connecting terminals may be plated through plating lines connected to the via-holes of the printed circuit board. The plating lines may extend to another edge of the printed circuit board where the connecting terminals are disposed. The plating lines may be in an outer layer of the printed circuit board. The plating lines may be in an inner layer of the printed circuit board.

The via-holes may be connected to termination resistors, and the termination resistors may be respectively connected to signal pins of the integrated circuit chip. Each of the via-holes may be adjacent to one end of a corresponding one of the termination resistors. The via-holes may be connected to damping resistors, and the damping resistors may be respectively connected to signal pins of the integrated circuit chip. The via-holes may be connected to the connecting terminals, and the connecting terminals may transmit a power supply voltage of the semiconductor module.

In accordance with another embodiment, a semiconductor module a printed circuit board including an integrated circuit chip and a buffer for the integrated circuit chip; connecting terminals at an edge of the printed circuit board; and first signal lines to respectively connect electrical connection pads of the buffer to the connecting terminals, wherein the connecting terminals are plated by first via-holes of the printed circuit board are respectively connected to the first signal lines.

The connecting terminals may be plated through first plating lines connected to the first via-holes of the printed circuit board. The first plating lines may extend to another edge of the printed circuit board where the connecting terminals are disposed. The first plating lines may be in an outer layer of the printed circuit board.

The semiconductor module may include second via-holes in second signal lines that respectively connect electrical connection pads of the integrated circuit chip to the connecting terminals; and second plating lines connected to the second via-holes. The second plating lines may extend to another edge of the printed circuit board where the connecting terminals are disposed. The second plating lines may be in an outer layer or inner layer of the printed circuit board. The first plating lines may be in an inner layer of the printed circuit board.

In accordance with another embodiment, a printed circuit board includes a plating line; at least one connecting terminal; at least one signal line connected between an electrical connection pad of an integrated circuit chip and the at least one connecting terminal; and at least one via hole including a conductive material connected to the at least one signal line, wherein the at least one connecting terminal is a plated terminal which is connected to the at least one via hole through the plating line, and wherein the plating line is in an inner layer of the printed circuit board. The printed circuit board may include a termination resistor connected to the at least one via hole. The integrated circuit chip may be a memory chip.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
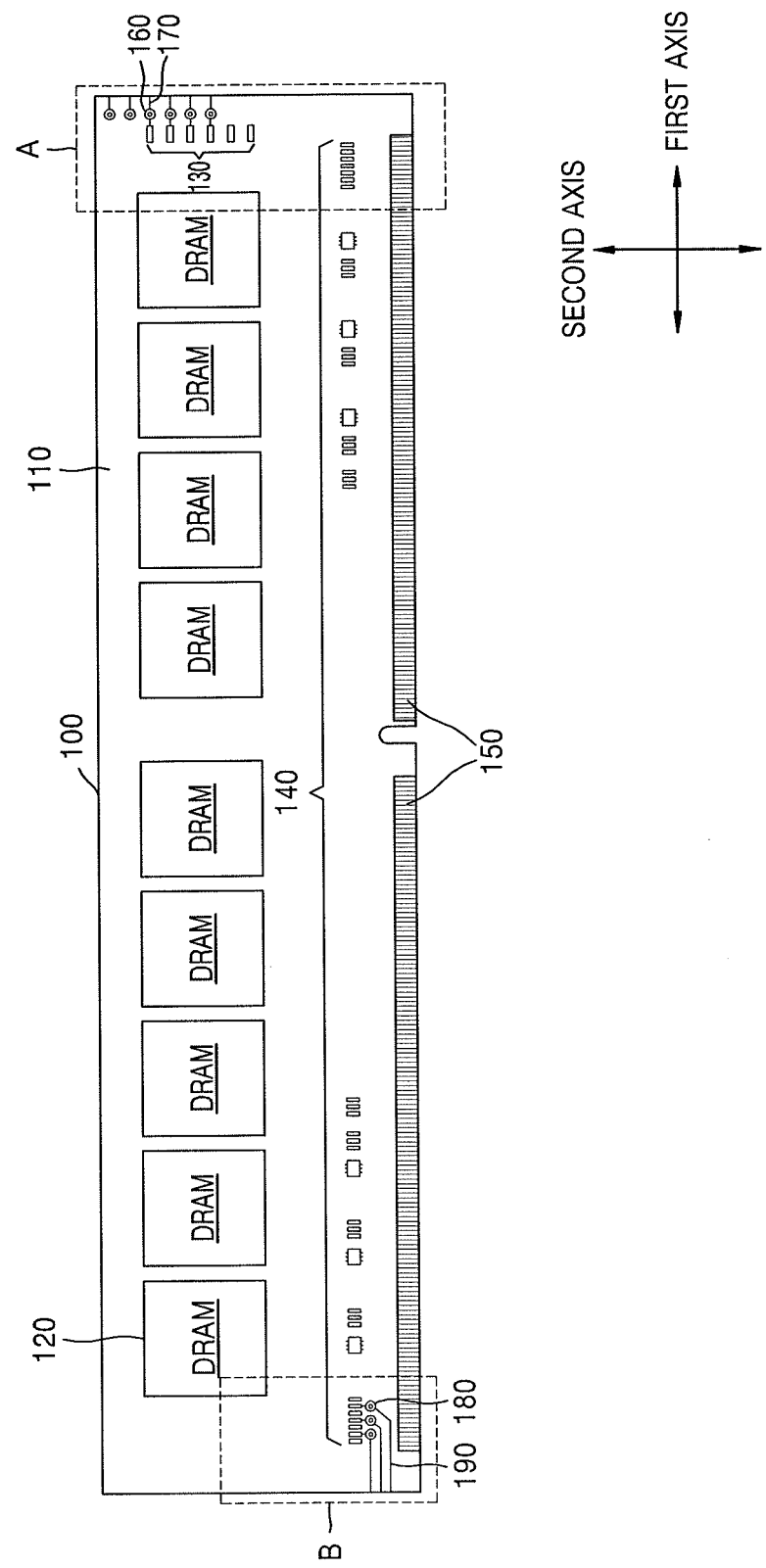
FIG. 1 illustrates an embodiment of a semiconductor module.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates a diagram of a semiconductor module 100 that has tab pins with no tie bars. The semiconductor module 100 may be used as or in a memory module or another electrical device.

Referring to FIG. 1, the semiconductor module 100 includes memory chips 120 and a first resistor part 130, which are mounted in a predetermined pattern (e.g., a line) on a surface layer (e.g., the uppermost layer or lowest layer) in a longitudinal direction, e.g., along a second axis, of the printed circuit board 110. The semiconductor module 100 further includes a second resistor part 140 separate from the memory chips 120. The second resistor part 140 may be arranged in a direction different from, e.g, orthogonal to, the first resistor part 130, e.g., in a width direction or along a first axis of the printed circuit board 110. In the semiconductor module 100, a tab 150 is at an edge portion of the printed circuit board 110 in the longitudinal direction of the printed circuit board 110. The tab 150 may have a plurality of connecting terminals referred to as tab pins. In another embodiment, the first resistor part 130 and the second resistor part 140 may be positioned differently from FIG. 1, for example, in order to provide a more flexible layout.

The semiconductor module 100 may be a dual in-line memory module (DIMM). For example, the semiconductor module 100 may be an unbuffered DIMM (U-DIMM), a registered DIMM (R-DIMM), a very low profile (VLP) R-DIMM, a fully buffered DIMM (FB-DIMM), or a load reduced DIMM (LR-DIMM).

The number of memory chips 120 may be determined according to the structure and input/output (I/O) configuration of the semiconductor module 100. For example, in a U-DIMM having an I/Ox72 configuration, nine memory chips, each having an I/Ox8 configuration, may be mounted on a first surface, and nine memory chips, each having the I/Ox8 configuration, may be mounted on a second surface. The second surface may be opposite to the first surface. In the current embodiment, a U-DIMM having an I/Ox72 configuration is described.

In the semiconductor module 100, memory chips 120 on a first surface may be respectively connected to memory chips 120 on a second surface through through-via-holes (TVHs) or blind-via-holes (BVHs) of the printed circuit board 110. Such a structure may reduce or minimize distances between balls of the memory chips 120 on the first surface and balls of the memory chips 120 on the second surface, which are connected to the TVHs or BVHs, and thus may reduce stubs. Accordingly, the fidelity of signals applied to the balls of the memory chips may be improved.

The memory chips 120 may include memory devices for storing data. For example, each of the memory chips 120 may include a dynamic random access memory (DRAM) device, and particularly may include a synchronous DRAM (SDAM) device that operates in synchronization with a clock signal. In another embodiment, each of the memory chips 120 may include, for example, a resistive RAM (RRAM) device, a phase RAM (PRAM) device, a magnetic RAM (MRAM) device, or a spin transfer torque MRAM (STT-MRAM) device. An embodiment where each of the memory chips 120 includes an SDRAM device is described below.

The first resistor part 130 includes, for example, one or more arrays of termination resistors. A termination resistor reduces or minimizes transmission line reflection with respect to signals transmitted through signal lines, e.g., transmission lines, and thus improves signal integrity and operating bandwidth. Transmission line reflection may occur due to driver impedance, receiver impedance, and/or a mismatch between the transmission lines.

Due to transmission line reflection, signals through the transmission lines swing with a signal voltage that deviates from a voltage level defined by logic "low" or logic "high." A receiver receiving such a signal may not correctly determine the received signal, thereby causing an incorrect result. In order to prevent an incorrect result, each of the signal lines is connected to one end of a termination resistor. The other end of the termination resistor is connected to a termination voltage. Each of the signal lines connected to the termination resistor may transmit, for example, a command, an address, a control signal, or a clock signal of the memory chips 120.

The second resistor part 140 includes, for example, one or more arrays of damping resistors. Also, the second resistor part 140 may include capacitor devices. The second resistor part 140 may dampen a signal reflection phenomenon, such as overshoot or undershoot. A damping resistor may have a first end connected to a signal line and a second end connected to a tab pin. Signal lines that are connected to damping resistors may each transmit a data input/output signal of the memory chips 120. The signal lines that are connected to the damping resistors may be referred to as data lines.

Command/address/clock signal/control signal input pins and data input/output signal pins may be included in a tab 150. In the tab 150, tab pins for transmitting the command, the address, the clock signal, and/or the control signal may be electrically connected to the first resistor part 130 of the printed circuit board 110. In the tab 150, data tab pins for transmitting the data input/output signal may be electrically connected to the memory chips 120 through the second resistor part 140.

The printed circuit board 110 of the memory module 100 may include multiple layers. Signal lines for respectively connecting the command/address/clock signal/control signal input pins of the memory chips 120 to termination resistors of the first resistor part 130 may be formed in an inner layer of the multiple layers. The signal lines may be electrically connected to via-holes 160 of the printed circuit board 110. The via-holes 160 may be, for example, TVHs, BVHs, laser-via-holes (LVHs), or micro-via-holes (MVHs).

The via-holes 160 connected to the signal lines, that are respectively connected to the command/address/clock signal/control signal input pins of the memory chips 120, may be respectively connected through the inner layer to the tab pins for transmitting the command, the address, the clock signal, and/or the control signal. The tab pins for transmitting the command, the address, the clock signal, and/or the control signal may be plated using the via-holes 160. The via-holes 160 are connected to first plating lines 170. The first plating lines 170 are provided to plate the tab pins for transmitting the command, the address, the clock signal, and/or the control signal.

The first plating lines 170 may extend to an edge other than an edge of the printed circuit board 110 in which the tab 150 is formed. In the current embodiment, if the tab 150 is formed in a lower side of the printed circuit board 110, the first plating lines 170 connected to the via-holes 160 may extend to a right side edge of the printed circuit board 110.

According to an embodiment, the first plating lines 170 may extend to an upper edge or left side edge of the printed circuit board 110.

Data lines for respectively connecting damping resistors of the second resistor part 140 to the data tab pins may be formed in an inner layer of the printed circuit board 110. The data lines may be electrically connected to via-holes 180 of the printed circuit board 110. The via-holes 180 may be, for example, TVHs, BVHs, LVHs, or MVHs. The via-holes 180 connected to the data lines may be connected to the data tab pins of the tab 150 through the internal layer. The data tab pins may be plated using the via-holes 180. The via-holes 180 are connected to second plating lines 190. The second plating lines 190 are provided to plate the data tab pins for transmitting the data input/output signal.

The second plating lines 190 may extend to an edge other than the edge of the printed circuit board 110 in which the tab 150 is formed. In the current embodiment, if the tab 150 is formed in a lower side of the printed circuit board 110, the second plating lines 190 connected to the via-holes 180 may extend to a left side edge of the printed circuit board 110. According to an embodiment, the second plating lines 190 may extend to an upper edge or right side edge of the printed circuit board 110.

Figure 2:
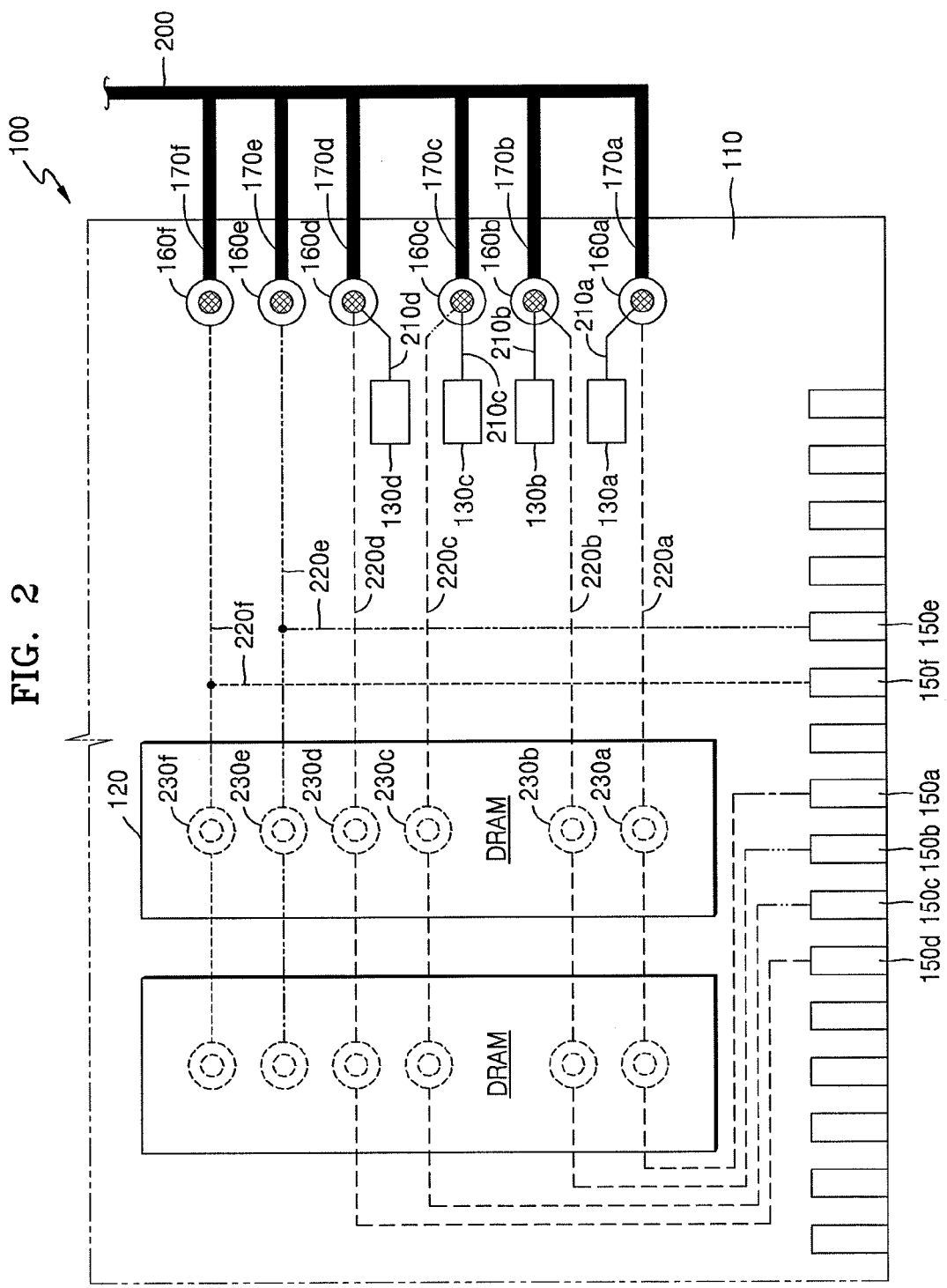
FIG. 2 illustrates an example of a first resistor part area.

FIG. 2 illustrates an example of a first resistor part area A of the semiconductor module 100 of FIG. 1. For simplification of illustration, only four termination resistors are shown in FIG. 2.

Referring to FIG. 2, first ends of termination resistors 130a to 130d, in the first resistor part 130 of the semiconductor module 100, are respectively connected to first signal lines 210a to 210d and via-holes 160a to 160d. Second ends of the termination resistors 130a to 130d are connected to a termination voltage. The termination voltage may be provided to the second ends of the termination resistors 130a to 130d through an inner layer or outer layer of the printed circuit board 110, which is connected to a tab pin for transmitting the termination voltage VTERM in the tab 150.

In order to reduce or minimize the lengths of the first signal lines 210a to 210d that respectively connect the termination resistors 130a to 130d to the via-holes 160a to 160d, the first ends of the termination resistors 130a to 130d and the via-holes 160a to 160d are disposed adjacent to each other. For example, the first ends of the termination resistors 130a to 130d, which are connected to the via-holes 160a to 160d, may be adjacent to the via-holes 160a to 160d. Accordingly, the fidelity of signals through the first signal lines 210a to 210d is improved.

The via-holes 160a to 160d connected to the first signal lines 210a to 210d are respectively connected to second signal lines 220a to 220d formed in an inner layer of the printed circuit board 110. The second signal lines 220a to 220d may be connected to pins of the memory chips 120, and may be respectively connected to tab pins 150a to 150d for transmitting a command, an address, a clock signal, and/or a control signal. The pins of the memory chips 120 may be, for example, ball terminals and may be electrically connected to the via-holes 230a to 230d in the printed circuit board 110. (In FIG. 2, for convenience of understanding, lines and via-holes that are formed in an inner layer are indicated by dashed lines.)

In one embodiment, a command, an address, a clock signal, and a control signal, which are transmitted to the tab pins 150a to 150d, are transmitted to the termination resistors 130a to 130d through the second signal lines 220a to 220d, the via-holes 160a to 160d, and the first signal lines 210a to 220d. The command, the address, the clock signal, and the control signal may be transmitted to the memory chips 120, for example, via a fly-by topology method, e.g., serially and sequentially from a left-sided first memory chip of the semiconductor module 100 to a right-sided last memory chip of the semiconductor module 100. The fly-by topology method may secure improved signal quality.

The tab pins 150e and 150f transmit a power supply voltage VDD and a reference (e.g., ground) voltage VSS to the memory chips 120, and may be connected to the second signal lines 220a and 220f in the inner layer of the printed circuit board 110. The second signal lines 220e and 220f are electrically connected to power supply ball terminals of the memory chips 120 through the via-holes 230e and 230f in the printed circuit board 110. Also, the second signal lines 220e and 220f may be connected to the via-holes 160e and 160f.

The via-holes 160a to 160f are respectively connected to first plating lines 170a to 170f. The first plating lines 170a to 170f may extend to a right side edge of the printed circuit board 110. The first plating lines 170a to 170f are connected to a power supply line 200, and the power supply line 200 may be connected to an external power supply source. The first plating lines 170a to 170f and the power supply line 200 are formed in an outer layer or surface layer of the printed circuit board 110.

The printed circuit board 110 in the semiconductor module 100 may be one of a plurality of printed circuit board units formed in a printed circuit board panel. A process of manufacturing the printed circuit board 110 may include, for example, a process of forming a circuit of an inner layer and outer layer, a stacking process, a drilling process, a solder mask process, an electro plating process or an electroless plating process, a router process, an inspection and test process, and the like.

The process of forming a circuit of an inner layer and outer layer may include, for example, forming a circuit in a copper conductive layer. The stacking process may include, for example, alternately stacking an insulating layer and a conductive layer and applying heat and pressure thereto to obtain a stack structure having a predetermined thickness. The drilling process may include, for example, forming via-holes, which are electrical connection holes between layers, using a mechanical drill or a laser drill. The solder mask process is a process of forming a protective layer of a solder resist or a photo solder resist on the surface of a semi-finished printed circuit board with respect to which processes from an initial process to an outer layer process have been finished.

The electro plating process and electroless plating process may include forming a gold area, a nickel area, or another metal or conductive area, on a tab pin and pad portion after the drill process or the solder mask process is completed. The electro plating process may include forming a plating layer by applying current to a conductive substrate. The electroless plating process may include imparting plating properties to an insulator using a catalyst. The router process may include dividing a plurality of printed circuit boards arranged on a working panel into individual units or array units. The inspection process may be a process of inspecting an inner layer or outward appearance of a printed circuit board, and may include inspecting a finished printed circuit board for defects, such as copper exposure of the finished printed circuit board or warping of the solder mask. The test process may include testing the electrical characteristics of the printed circuit board. Examples of the test process include a burn-in board test, an impedance test, or the like.

In the electro plating process, the printed circuit board with the power supply line 200 and the first plating lines 170a to 170f formed thereon is socked in a tank filled with an electrolytic solution. The electrolytic solution contains a material, such as gold, silver, copper, or nickel, where the material is connected to the positive pole of an external power supply device. For example, a gold potassium cyanide (KAu(CN)2) solution may be used as the electrolytic solution. The gold potassium cyanide (KAu(CN)2) solution is electrolyzed into a positive potassium ion (K+) and a negative gold cyanide ion (Au(CN)2-). The negative gold cyanide ion (Au(CN)2-) is electrolyzed into a positive gold ion (Au+) and a negative cyanide ion (2CN-). The power supply line 200 is connected to the negative pole of the external power supply device and connects a portion to be plated to the printed circuit board 110.

The power supply line 200 and the first plating lines 170a to 170f are connected to the tab pins 150a to 150f through the via-holes 160a to 160f and the second signal lines 220a to 220f. The tab pins 150a to 150f may be plated, for example, during the electro plating process. Next, in the router process, the power supply line 200 and the first plating lines 170a to 170f are cut and separated from the printed circuit board 110. Since a plating line is not formed on the tab pins 150a to 150f, the tab pins 150a to 150f are plated without formation of a tie bar.

Figure 3:
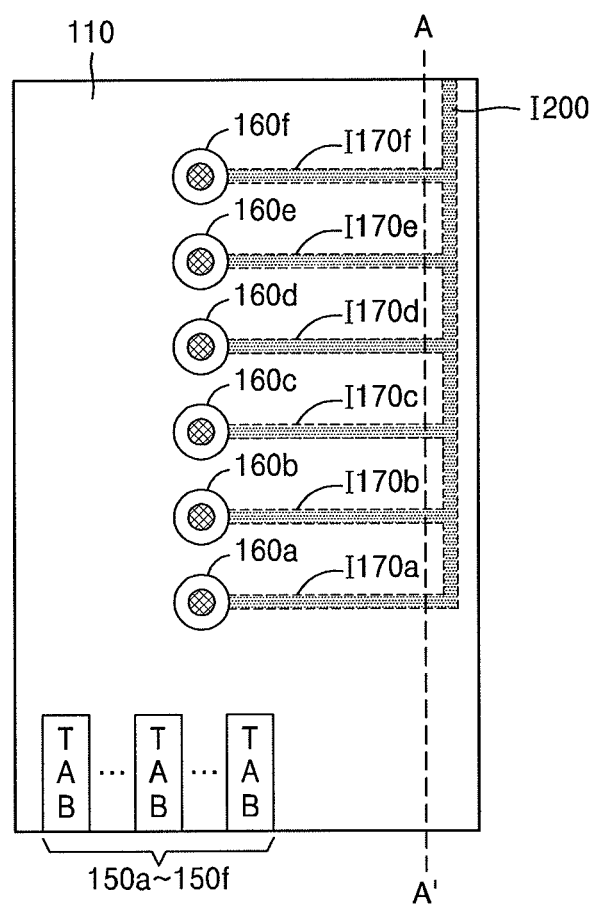
FIGS. 3 and 4 illustrate examples of plating lines.
Figure 4:
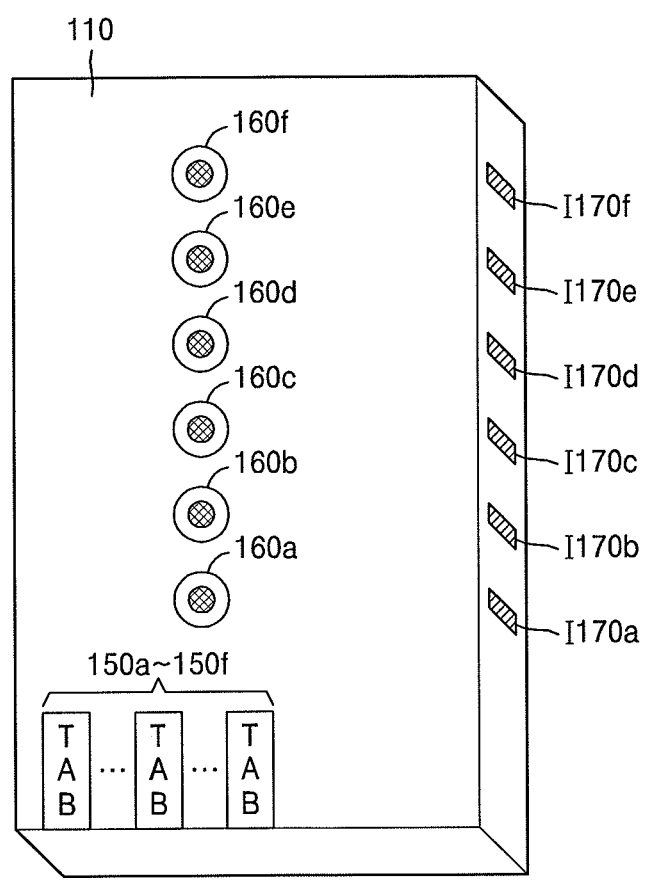

According to an embodiment, since the first plating lines 170a to 170f are connected to the via-holes 160a to 160f, the first plating lines 170a to 170f may be formed in an inner layer of the printed circuit board 110 as shown in FIGS. 3 and 4. FIGS. 3 and 4 illustrate cases in which first plating lines I170a to I170f and a power supply line I200 are formed in an inner layer of the printed circuit board 110, unlike the semiconductor module 100 of FIG. 2.

Referring to FIG. 3 in connection with FIG. 2, the first plating lines I170a to I170f of the printed circuit board 110 are formed in an inner layer. The power supply line I200 connected to the first plating lines I170a to I170f are also formed in the inner layer of the printed circuit board 110. The power supply line I200 and the first plating lines I170a to I170f are connected to the via-holes 160a to 160f. The via-holes 160a to 160f are connected to the tab pins 150a to 150f through the second signal lines of FIG. 2. The tab pins 150a to 150f are plated via an electro plating process. Next, a router process is performed in which a structure of FIG. 3 is cut along a dashed line A-A' in a router process, thereby obtaining a structure in which the first plating lines I170a to I170f are buried in an inner layer of the printed circuit board 110.

Figure 5:
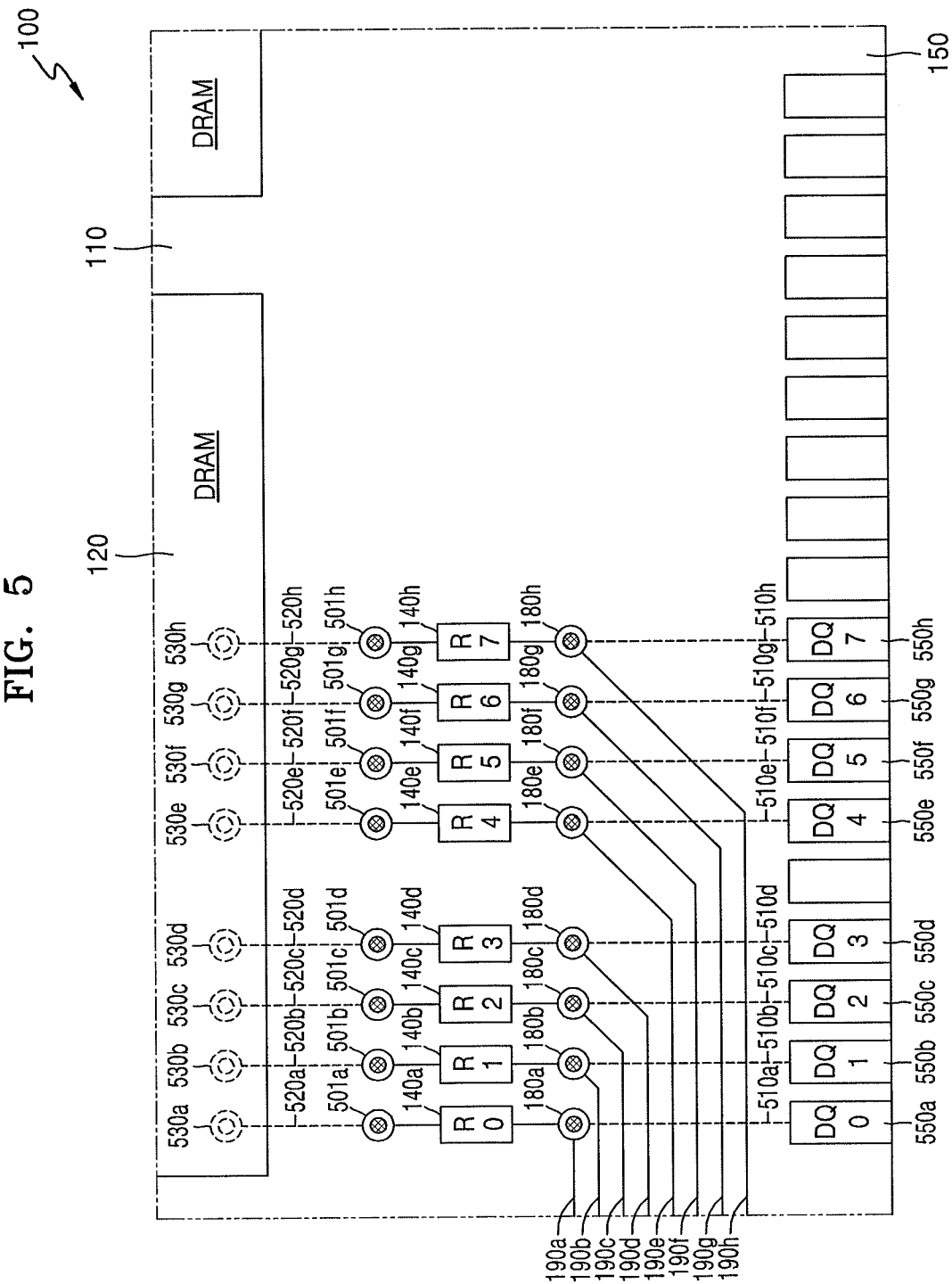
FIG. 5 illustrates an example of a second resistor part area.

FIG. 5 illustrates an example of a second resistor part area B of the semiconductor module of FIG. 1. For simplification of illustration, only eight damping resistors are shown in FIG. 5.

Referring to FIG. 5, the second resistor part 140 of the memory module 100 includes damping resistors 140a to 140h. First terminals of the damping resistors 140a to 140h are respectively connected to first via-holes 180a to 180h, and second terminals of the damping resistors 140a to 140h are respectively connected to second via-holes 501a to 501h. The first via-holes 180a to 180h are respectively connected to third signal lines 510a to 510h. The third signal lines 510a to 510h may be respectively connected to tab pins 550a to 550d of a tab 150, which transmits data input/output signals DQ0 to DQ7.

The second via-holes 501a to 501h are respectively connected to fourth signal lines 520a to 520h. The fourth signal lines 520a to 520h are connected to balls for the data input/output signals DQ0 to DQ7 of the memory chip 120. The balls for the data input/output signals DQ0 to DQ7 may be electrically connected to via-holes 530a to 530h formed in the printed circuit board 110. In the current embodiment, the third and fourth signal lines 510a to 510h and 520a to 520h are formed in an inner layer of the printed circuit board 110. According to an embodiment, the third and fourth signal lines 510a to 510h and 520a to 520h may be formed in an outer layer of the printed circuit board 110.

The first via-holes 180a to 180h are respectively connected to the second plating lines 190a to 190h. The second plating lines 190a to 190h may be formed in an outer layer of the printed circuit board 110 and extend to a left side edge of the printed circuit board 110.

The second plating lines 190a to 190h may be connected to a power supply line of an external power supply device. The power supply line and the second plating lines 190a to 190h are connected to DQ tab pins 550a to 550h through the first via-holes 180a to 180h and the third signal lines 510a to 510h. The DQ tab pins 550a to 550h are plated during the electro plating process. Next, in the router process, the power supply line and the second plating lines 190a to 190h are cut and separated from the printed circuit board 110. Since a plating line is not formed in the DQ tab pins 550a to 550h, the DQ tab pins 550a to 550h are plated without formation of a tie bar.

According to an embodiment, the second plating lines 190a to 190h may be formed in an inner layer of the printed circuit board 110, and thus may be connected to the first via-holes 180a to 180h. Accordingly, the second plating lines 190a to 190h may be buried in the inner layer of the printed circuit board 110.

No-connection pins, other than the command/address/clock signal/control signal input pins, the power supply pins, and the data input/output signal pins, may be included in the tab 150 of the memory module 100. A portion of the tab 150, which corresponds to the command/address/clock signal/control signal input pins, the power supply pins, and the data input/output signal pins, may be plated with plating lines that are connected to via-holes of the printed circuit board 110. A portion of the tab 150, which corresponds to the no-connection pins, may also be plated with plating lines that are connected to via-holes of the printed circuit board 110. According to an embodiment, the portion of the tab 150, which includes the no-connection pins, may be plated with a plating line formed in a tab pin. Although a plating line may exist in the no-connection pins, the occurrence of an electrical short between the no-connection pins or an electrical short to a no-connection pin is relatively reduced.

Figure 6:
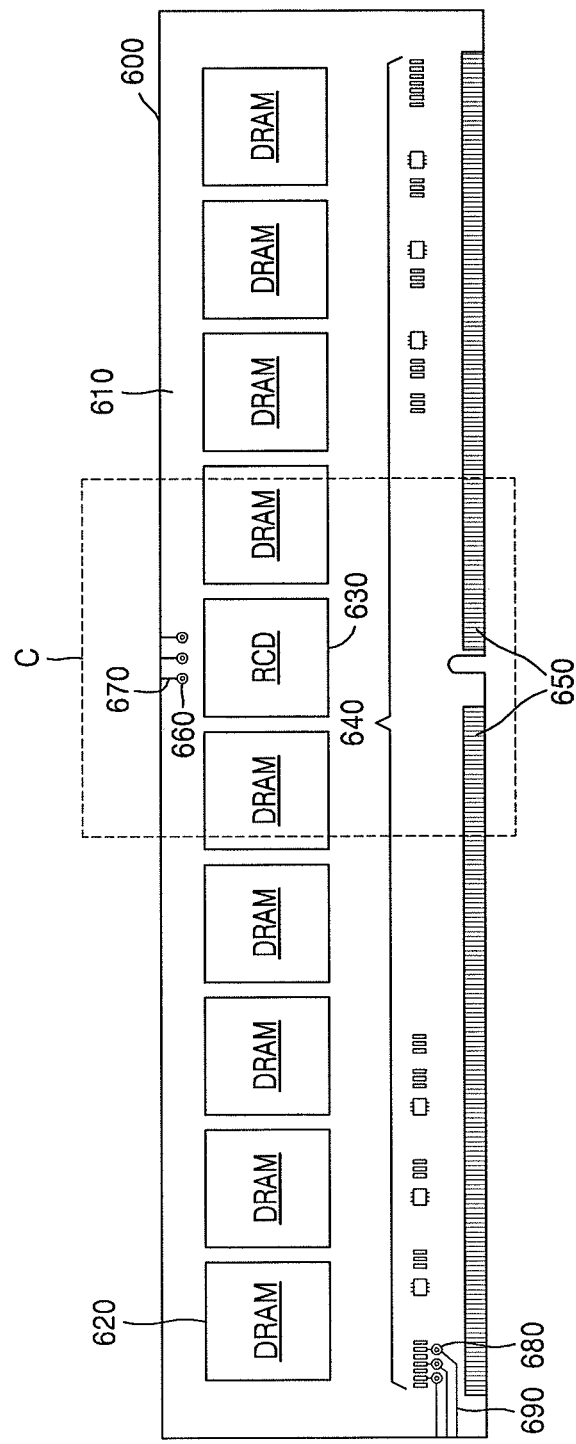
FIG. 6 illustrates another embodiment of a semiconductor module.

FIG. 6 illustrates another embodiment of a semiconductor module 600 that has tab pins with no tie bar. The semiconductor module 600 and may be used, for example, as a memory module or another type of device.

Referring to FIG. 6, the semiconductor module 600 includes a buffer 630 on a first surface of a printed circuit board 6100. However, unlike the semiconductor module 100 of FIG. 1, the semiconductor module 60 does not include the first resistor part 130. The semiconductor module 600 may have, for example, an R-DIMM structure.

The semiconductor module 600 includes memory chips 620 and a buffer 630, which are mounted in a line on a surface layer of a printed circuit board 610 in a longitudinal direction, e.g., along a second axis of the printed circuit board 610. The buffer 630 may be referred to as a register. Also, the memory module 600 includes a resistor part 640 that is disposed to be separate from the memory chips 120 in a width direction, e.g., along a first axis, of the printed circuit board 110. In the memory module 600, a tab 650 is formed in an edge portion of the printed circuit board 110 in the longitudinal direction of the printed circuit board 610.

The buffer 630 may be connected to the tab pins of the tab 650, which transmit a command, an address, a clock signal, and/or a control signal. The buffer 630 may buffer and re-drive the command, the address, the control signal, and/or the clock signal, which are received through the tab 650. The command, the address, the control signal, and/or the clock signal, output from the buffer 630, may be provided to the memory chips through control signal lines. For example, the command, the address, the control signal, and the clock signal, output from the buffer 630, may be provided through common signal lines for all the memory chips 620, may be provided through signal lines for each of the memory chips 620, or may be provided through signal lines for each group including several memory chips 620

The buffer 630 may be connected to the tab pins through signal lines formed in an inner layer or an outer layer of the printed circuit board 610. The signal lines may be electrically connected to input pins (or balls) of the buffer 630. Via-holes 660 may be connected to the signal lines. The via-holes 660 may be respectively connected to first plating lines 670.

The first plating lines 670 may extend to an upper edge of the printed circuit board 610. The first plating lines 670 are provided to plate tab pins that transmit the command, the address, the clock signal, and/or the control signal.

Although the buffer 630 in FIG. 6 is disposed in the center of the printed circuit board 610, the buffer 630 may be disposed in an area other than the center, for example, to provide a more flexible layout. According to an embodiment, when the buffer 630 is disposed in the left side of the printed circuit board 610, the first plating lines 670 may extend to an upper edge or left side edge of the printed circuit board 610. According to an embodiment, when the buffer 630 is disposed in the right side of the printed circuit board 610, the first plating lines 670 may extend to an upper edge or right side edge of the printed circuit board 610.

The resistor part 640 includes a damping resistor array, similar to the second resistor part 140 of FIG. 1. Data lines for respectively connecting damping resistors of the resistor part 640 to data tab pins may be formed in an inner layer of the printed circuit board 610. The data lines may be electrically connected to via-holes 680 of the printed circuit board 610. The via-holes 680, connected to the data lines, may be connected to data tab pins of the tab 650 through an inner layer. The via-holes 680 are connected to second plating lines 690. The second plating lines 690 are provided to plate tab pins transmitting data input/output signals. The second plating lines 690 may extend to the left side of the printed circuit board 610. According to an embodiment, the second plating lines 690 may extend to an upper edge or right side edge of the printed circuit board 610.

No-connection pins, other than command/address/clock signal/control signal input pins, power supply pins, and data input/output signal pins, may be included the tab 650 of the memory module 600. A portion of the tab 650, which corresponds to the command/address/clock signal/control signal input pins, the power supply pins, and the data input/output signal pins, may be plated with plating lines that are connected to via-holes of the printed circuit board 110. A portion of the tab 650, which corresponds to the no-connection pins, may be plated with plating lines that are connected to via-holes of the printed circuit board 110. According to an embodiment, the portion of the tab 650, which includes the no-connection pins, may be plated with a plating line formed in a tab pin. Although a plating line may exist in the no-connection pins, the occurrence of an electrical short between the no-connection pins or an electrical short to a no-connection pin is relatively reduced.

Figure 7:
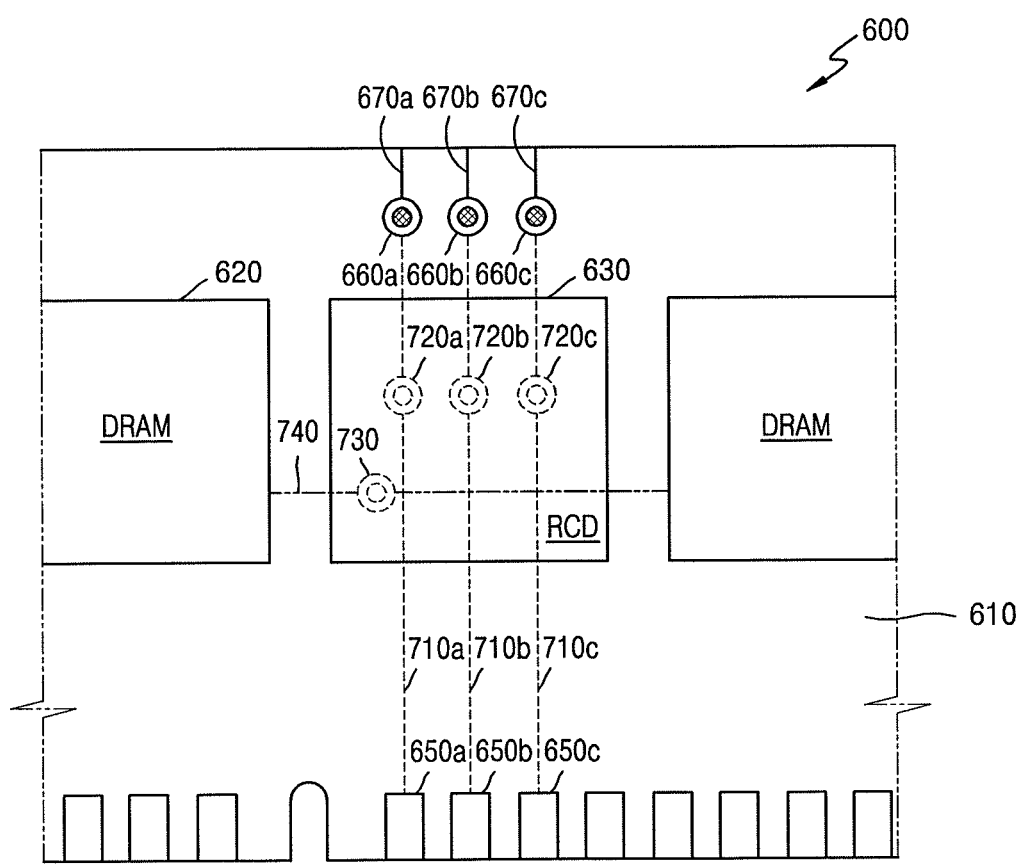
FIG. 7 illustrates a first example of a buffer area of a memory module.

FIG. 7 illustrates a first example of a buffer area C of the memory module of FIG. 6. For simplification of illustration, only four termination resistors are shown in FIG. 2 and only three via-holes are illustrated in FIG. 7 that are connected to the first plating lines 670.

Referring to FIG. 7, the buffer 630 of the memory module 600 is connected to tab pins 650a to 650a of the tab 650, which transmit a command, an address, a clock signal, and/or a control signal through first signal lines 710a to 710c. The tab pins 650a to 650a may include tab pins for transmitting power supply voltages VDD and VSS. First signal lines 710 to 710c may be formed in an inner layer of the printed circuit board 610 and may be electrically connected to ball terminals of the buffer 630. The first signal lines 710 to 710c may be connected to via-holes 720a to 720c formed in the printed circuit board 610, and the via-holes 720a to 720c may be connected to the ball terminals of the buffer 630.

The command, the address, the control signal, and/or the clock signal, which are output from the buffer 630, may be electrically connected to pins (or ball terminals) of the memory chips 620 through via-holes 730 and control signal lines 740. The control signal lines 740 may be formed in an inner layer of the printed circuit board 610. According to an embodiment, the control signal lines 740 may be formed in an outer layer of the printed circuit board 610 and may be electrically connected to the pins (or ball terminals) of the memory chips 620.

The first signal lines 710a to 710c may be connected to via-holes 660a to 660c formed in the printed circuit board 610. The via-holes 660a to 660c are respectively connected to first plating lines 670a to 670c. The first plating lines 670a to 670c may be formed in an outer layer of the printed circuit board 610 and extend to an upper edge of the printed circuit board 610.

The first plating lines 670a to 670c may be connected to a power supply line of an external power supply device. The power supply line and the first plating lines 670a to 670c are connected to tab pins 650a to 650c through the via-holes 660a to 660c and the first signal lines 710a to 710c. During an electro plating process, the tab pins 650a to 650c are plated. Next, in a router process, the power supply line and the first plating lines 670a to 670c are cut and separated from the printed circuit board 610. Since a plating line is not disposed in the tab pins 650a to 650c, the tab pins 650a to 650c transmitting a command, an address, a clock signal, a control signal, and/or a power supply voltage are plated without a tie bar.

Figure 8:
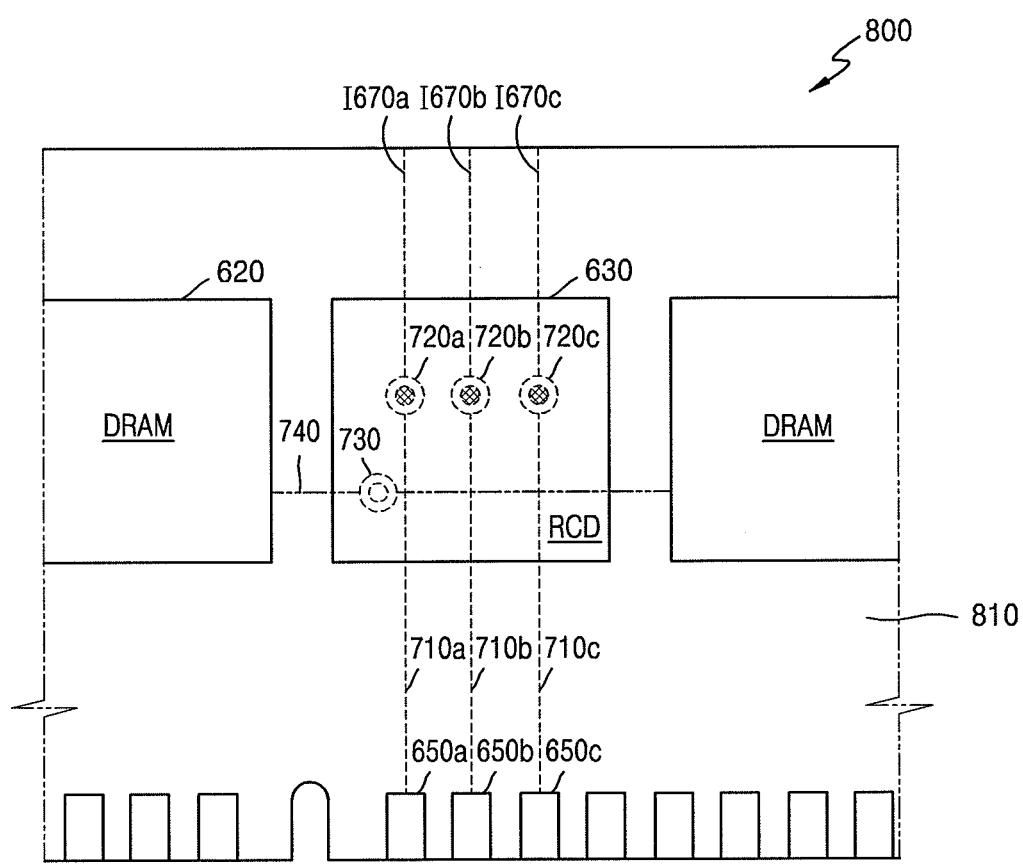
FIG. 8 illustrates a second example of a buffer area of a semiconductor module.

FIG. 8 illustrates a second example of a buffer area C of the memory module of FIG. 6. Referring to FIG. 8, unlike the memory module 600 of FIG. 7, first plating lines I670a to I670c of a memory module 800 are formed in an inner layer of a printed circuit board 810. The first plating lines I670a to I670c are connected to via-holes 720a to 720c that are connected to first signal lines 710a to 710c. The first signal lines 710a to 710c are connected to tab pins 650a to 650c of a tab 650, which transmits a command, an address, a clock signal, a control signal, and/or a power supply voltage. The via-holes 720a to 720c may be connected to ball terminals of a buffer 630.

The first plating lines I670a to I670c may be connected to a power supply line formed in an inner layer of the printed circuit board 810. The power supply line and the first plating lines 1670a to 1670c are connected to the tab pins 650a to 650c through the via-holes 720a to 720c and the first signal lines 710a to 710c. During an electro plating process, the tab pins 650a to 650c are plated. Next, in a router process, the power supply line and the first plating lines 1670a to 1670c are cut and separated from the printed circuit board 810. Since a plating line is not disposed in the tab pins 650a to 650c, the tab pins 650a to 650c transmitting a command, an address, a clock signal, a control signal, and/or a power supply voltage are plated without a tie bar.

Figure 9:
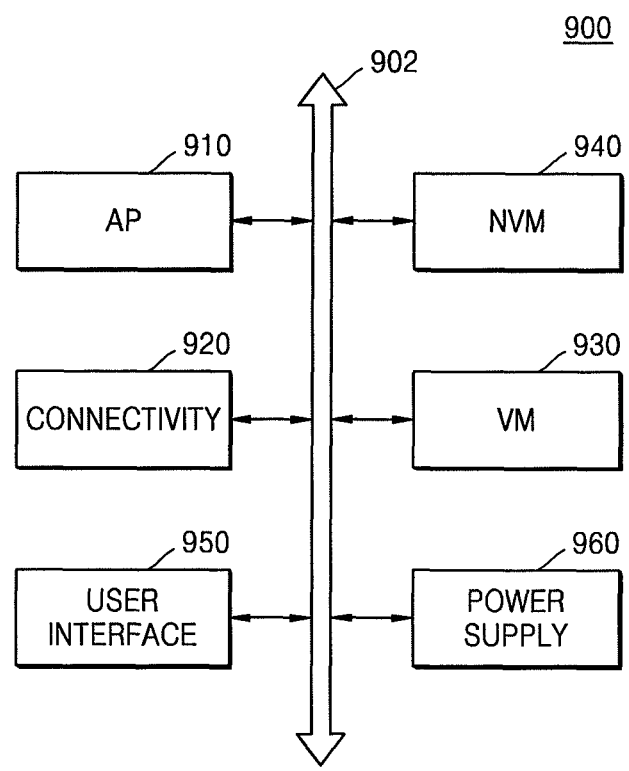
FIG. 9 illustrates an embodiment of a mobile system.

FIG. 9 illustrates an embodiment of a mobile system 900, which uses any of the aforementioned embodiments of a memory module in which there is no tie bar in tab pins.

Referring to FIG. 9, the mobile system 900 may include an application processor 910, a connectivity unit 920, a first memory device 930, a second memory device 940, a user interface 950, and a power supply 960, which are connected to one another through a bus 902. The first memory device 930 may be a volatile memory device, and the second memory device 940 may be a nonvolatile memory device. In some embodiments, the mobile system 900 may be an arbitrary mobile system such as a mobile phone, a smart phone, a personal digital assistant (PDA), a portable multimedia player (PMP), a digital camera, a music player, a portable game console, or a navigation system.

The application processor 910 may execute applications providing, for example, an Internet browser, games, and moving pictures. In some embodiments, the application processor 910 may include a processor core (single core) or a plurality of processor cores (multi-core). For example, the application processor 910 may include a dual-core, a quad-core, or a hexa-core. Also, the application processor 910 may include a cache memory located in or outside the application processor 910.

The connectivity unit 920 may communicate with an external device wirelessly or through wires. For example, the connectivity unit 920 may perform Ethernet communication, near field communication (NFC), radio frequency identification (RFID) communication, mobile telecommunication, memory card communication, or universal serial bus (USB) communication. For example, the connectivity unit 920 may include a base band chipset and may support communication such as GSM, GRPS, WCDMA, and HSxPA.

The first memory device 930 is a volatile memory device that may store data processed by the application processor 910, or that may operate as a working memory. The first memory device 930 may be a memory module in which there is no tie bar in tab pins. The first memory device 930 may include memory chips disposed in line in a portion of a surface layer of a printed circuit board including multiple layers, connecting terminals disposed in an edge portion of the printed circuit board, first via-holes disposed in first signal lines that respectively connect electrical connection pads of the memory chips to the connecting terminals, and first plating lines connected to the first via-holes to plate the connecting terminals.

The first memory device 930 may further include a buffer for driving a memory chip, second via-holes disposed in second signal lines that respectively connect electrical connection pads of the buffer to connecting terminals, and second plating lines connected to the second via-holes to plate the connecting terminals. The first and second plating lines may extend to an edge other than an edge portion of the printed circuit board in which the connecting terminals are disposed, and may be formed in an outer layer or inner layer of the printed circuit board.

The second memory device 940 is a nonvolatile memory device that may store a boot image for booting the mobile system 900. For example, the second memory device 940 may be electrically erasable programmable read-only memory (EEPROM), a flash memory, phase change random access memory (PRAM), resistance random access memory (RRAM), a nano floating gate memory (NFGM), polymer random access memory (PoRAM), magnetic random access memory (MRAM), ferroelectric random access memory (FRAM), or the like.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

The user interface 950 may include one or more input devices such as a keypad and a touch screen, and/or a speaker, a display device, and one or more output devices. The power supply 960 may supply an operating voltage. Also, in some embodiments, the mobile system 900 may include a camera image processor (CIP), and may further include a storage device such as a memory card, a solid state drive (SSD), a hard disk drive (HDD), and a CD-ROM.

Figure 10:
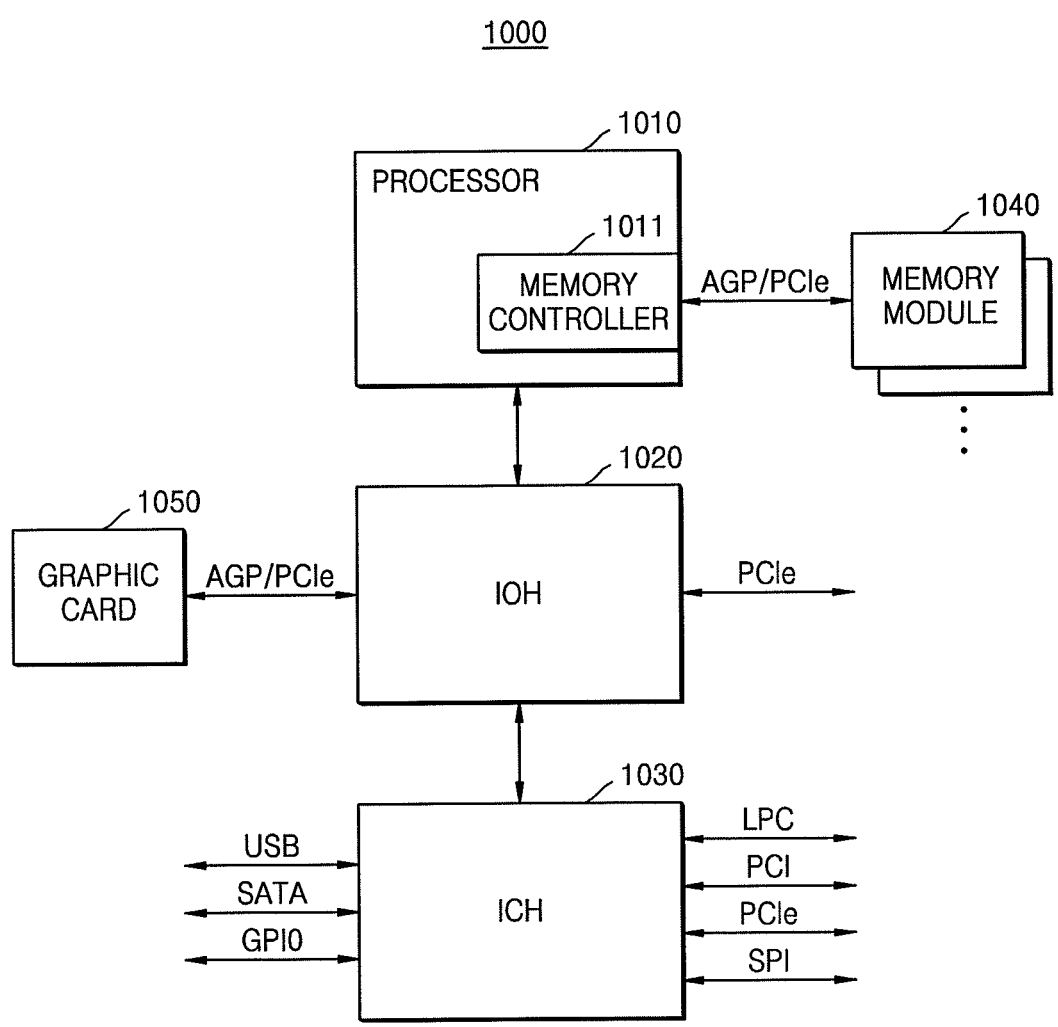
FIG. 10 illustrates an embodiment of a computer system.

FIG. 10 illustrates an embodiment of a computer system 1000, which uses an any of the aforementioned embodiments of a memory module in which there is no tie bar in tab pins.

Referring to FIG. 10, the computer system 1000 includes a processor 1010, an input/output hub 1020, an input/output controller hub 1030, at least one memory module 1040, and a graphics card 1050. In some embodiments, the computer system 1000 may be a computing system, such as a personal computer (PC), a server computer, a workstation, a laptop computer, a mobile phone, a smartphone, a PDA, a PMP, a digital camera, a digital TV, a set-top box, a music player, a portable game console, or a navigation system.

The processor 1010 may execute various computing functions such as certain calculations or tasks. For example, the processor 1010 may be a micro-processor or a CPU. In some embodiments, the processor 1010 may include one processor core (single core) or a plurality of processor cores (multi-core). For example, the processor 1010 may include a dual-core, a quad-core, or a hexa-core. Also, although the computer system 1000 of FIG. 10 includes one processor 1010, the computer system 1000 may include a plurality of processors according to another embodiment. Also, the processor 1010 may include a cache memory located inside or outside thereof.

The processor 1010 may include a memory controller 1011 for controlling operations of the memory module 1040.

The memory controller 1011 in the processor 1010 may be referred to as an integrated memory controller (IMC). A memory interface between the memory controller 1011 and the memory module 1040 may include one channel including a plurality of signal lines, or a plurality of channels. In addition, one or more memory modules 1040 may be connected to each of the channels. In some embodiments, the memory controller 1011 may be located in the input/output hub 1020. The input/output hub 1020 including the memory controller 1011 may be referred to as a memory controller hub (MCH).

The memory module 1040 may be a memory module in which there is no tie bar in tab pins. The memory module 1040 may include memory chips disposed in line in a portion of a surface layer of a printed circuit board including multiple layers, connecting terminals disposed in an edge portion of the printed circuit board, first via-holes disposed in first signal lines that respectively connect electrical connection pads of the memory chips to the connecting terminals, and first plating lines connected to the first via-holes to plate the connecting terminals.

The memory module 1040 may further include a buffer for driving a memory chip, second via-holes disposed in second signal lines that respectively connect electrical connection pads of the buffer to connecting terminals, and second plating lines connected to the second via-holes to plate the connecting terminals. The first and second plating lines may extend to an edge other than an edge portion of the printed circuit board in which the connecting terminals are disposed, and may be formed in an outer layer or inner layer of the printed circuit board.

The input/output hub 1020 may manage data transmission between the devices such as the graphics card 1050 and the processor 1010. The input/output hub 1020 may be connected to the processor 1010 via various kinds of interfaces. For example, the input/output hub 1020 and the processor 1010 may be connected to each other via various interfaces such as a front side bus (FSB), a system bus, hypertransport, lighting data transport (LDT), quickpath interconnect (QPI), a common system interface, or peripheral component interface-express (PCIe). In FIG. 10, the computer system 1000 includes one input/output hub 1020. In another embodiment, the computer system 1000 may include a plurality of input/output hubs.

The input/output hub 1020 may provide various interfaces to devices. For example, the input/output hub 1020 may provide an accelerated graphics port (AGP) interface, a (PCIe), and a communications streaming architecture (CSA) interface.

The graphics card 1050 may be connected to the input/output hub 1020 via the AGP or the PCIe. The graphics card 1050 may control a display device for displaying images. The graphics card 1050 may include an internal processor for processing image data, and an internal semiconductor memory. In some embodiments, the input/output hub 1020 may include a graphics device therein with the graphics card 1050 located on the outside of the input/output hub 1020, or instead of the graphics card 1050. The graphics device included in the input/output hub 1020 may be referred to as integrated graphics. Also, the input/output hub 1020, including the memory controller and the graphics device, may be referred to as a graphics and memory controller hub (GMCH).

The input/output controller hub 1030 may perform data buffering and interface relay so that various system interfaces operate effectively. The input/output controller hub 1030 may be connected to the input/output hub 1020 via an internal bus. For example, the input/output hub 1020 and the input/output controller hub 1030 may be connected to each other via a direct media interface (DMI), a hub interface, an enterprise southbridge interface (ESI), or PCIe.

The input/output controller hub 1030 may provide various interfaces to peripheral devices. For example, the input/output controller hub 1030 may provide a universal serial bus (USB) port, a serial advanced technology attachment (SATA) port, a general purpose input/output (GPIO) port, a low pin count (LPC) bus, a serial peripheral interface (SPI), PCI, or PCIe. In some embodiments, two or more of the processor 1010, the input/output hub 1020, or the input/output controller hub 1030 may be implemented as one chipset.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A semiconductor module, comprising:
   a printed circuit board including an integrated circuit chip;
   connecting terminals at an edge of the printed circuit board; and
   signal lines in an interior layer of the printed circuit board, the signal lines respectively connecting electrical connection pads of the integrated circuit chip to the connecting terminals, wherein the connecting terminals are plated by via-holes of the printed circuit board respectively connected to the signal lines and wherein the via-holes are connected to termination resistors and the termination resistors are respectively connected to signal pins of the integrated circuit chip.

2. The semiconductor module as claimed in claim 1, wherein the connecting terminals are plated through plating lines connected to the via-holes of the printed circuit board.

3. The semiconductor module as claimed in claim 2, wherein the plating lines extend to another edge of the printed circuit board where the connecting terminals are disposed.

4. The semiconductor module as claimed in claim 2, wherein the plating lines are in an outer layer of the printed circuit board.

5. The semiconductor module as claimed in claim 2, wherein the plating lines are in an inner layer of the printed circuit board.

6. The semiconductor module as claimed in claim 1, wherein each of the via-holes is adjacent to one end of a corresponding one of the termination resistors.

7. The semiconductor module as claimed in claim 1, wherein:
   the via-holes are connected to damping resistors, and
   the damping resistors are respectively connected to signal pins of the integrated circuit chip.

8. The semiconductor module as claimed in claim 1, wherein:
   the via-holes are connected to the connecting terminals, and the connecting terminals are to transmit a power supply voltage of the semiconductor module.

9. A semiconductor module, comprising:
a printed circuit board including an integrated circuit chip and a buffer for the integrated circuit chip;
connecting terminals at an edge of the printed circuit board;
first signal lines to respectively connect electrical connection pads of the buffer to the connecting terminals, wherein the first signal lines are in an interior layer of the printed circuit board and wherein the connecting terminals are plated by first via-holes of the printed circuit board and are respectively connected to the first signal lines;
second signal lines including second via-holes respectively connect electrical connection pads of the integrated circuit chip to the connecting terminals, and
plating lines connected to the second via-holes.

10. The semiconductor module as claimed in claim 9, wherein the connecting terminals are plated through first plating lines connected to the first via-holes of the printed circuit board, the first plating lines different form the plating lines connected to the second via-holes.

11. The semiconductor module as claimed in claim 10, wherein the first plating lines extend to another edge of the printed circuit board where the connecting terminals are disposed.

12. The semiconductor module as claimed in claim 10, wherein the first plating lines are in an outer layer of the printed circuit board.

13. The semiconductor module as claimed in claim 10, wherein the first plating lines are in an inner layer of the printed circuit board.

14. The semiconductor module as claimed in claim 9, wherein the plating lines connected to the second via-holes extend to another edge of the printed circuit board where the connecting terminals are disposed.

15. The semiconductor module as claimed in claim 9, wherein the plating lines connected to the second via-holes are in an outer layer of the printed circuit board.

16. A printed circuit board, comprising:
a substrate;
a plating line;
at least one connecting terminal;
at least one signal line connected between an electrical connection pad of an integrated circuit chip and the at least one connecting terminal;
at least one via hole including a conductive material connected to the at least one signal line; and
a termination resistor connected to the at least one via hole, wherein the at least one signal line is in an interior layer of the substrate, wherein the at least one connecting terminal is a plated terminal which is connected to the at least one via hole through the plating line, and wherein the plating line is in an inner layer of the printed circuit board.

17. The printed circuit board as claimed in claim 16, wherein the integrated circuit chip is a memory chip.

18. The printed circuit board as claimed in claim 17, wherein the memory chip comprises a three-dimensional memory array.

19. The printed circuit board as claimed in claim 18, wherein the three-dimensional memory comprises a non-volatile memory that is monolithically formed in one or more physical levels of memory cells having active areas disposed above a silicon substrate.

20. The printed circuit board as claimed in claim 18, wherein the three dimensional memory array comprises a plurality of memory cells, each of the memory cells including a charge trap layer.

21. The printed circuit board as claimed in claim 18, wherein word lines and/or bit lines in the three-dimensional memory array are shared between levels.

* * * * *